United States Patent [19]

Wimmer

[11] Patent Number: 4,585,975
[45] Date of Patent: Apr. 29, 1986

[54] HIGH SPEED BOOLEAN LOGIC TRIGGER OSCILLOSCOPE VERTICAL AMPLIFIER WITH EDGE SENSITIVITY AND NESTED TRIGGER

[75] Inventor: Warren K. Wimmer, Tigard, Oreg.

[73] Assignee: Tektronix, Inc., Beaverton, Oreg.

[21] Appl. No.: 487,398

[22] Filed: Apr. 21, 1983

[51] Int. Cl.[4] ................... G01R 13/28; H04L 67/00; G05B 19/02
[52] U.S. Cl. .................. 315/392; 315/367; 324/121 R; 324/102; 324/73 AT; 340/825.04; 364/487; 364/580
[58] Field of Search ............... 324/121, 73 AT, 102; 340/720, 825.04, 722, 715; 364/487, 580; 315/408, 364, 367, 392

[56] References Cited
U.S. PATENT DOCUMENTS
4,495,642  1/1985  Zellmer ........................ 364/487

Primary Examiner—Theodore M. Blum
Assistant Examiner—David Cain
Attorney, Agent, or Firm—Allston L. Jones; George T. Noe

[57] ABSTRACT

An oscilloscope vertical amplifier with Boolean combinatorial trigger generator capability is disclosed. While the display output is fully analog, the trigger output to the time base is digital with a user selectable Boolean function of the analog input signals. Also included is nested triggering, edge as well as level sensitivity, and a trigger filter to selectively inhibit high frequency events. The delay times of the analog and digital signal paths are matched by means of analog delay lines before presentation by a visual display to present the analog and digital signals in time coincidence to the oscilloscope main frame.

18 Claims, 10 Drawing Figures

HIGH SPEED BOOLEAN LOGIC TRIGGER OSCILLOSCOPE VERTICAL AMPLIFIER WITH EDGE SENSITIVITY AND NESTED TRIGGER

BACKGROUND OF THE INVENTION

Both the oscilloscope and the digital logic analyzer have become important tools in the field of electronics. The oscilloscope has long been a fundamental tool to directly view and thus analyze analog signals, while the logic analyzer has recently taken over a similar role for digital signals. Unfortunately, as separate instruments, each has its limitations. Oscilloscopes are threshold triggered and thus it is often difficult and sometimes impossible to trigger the display at precisely the desired time to observe the analog characteristics of digital signals. With the logic analyzer, although triggering can be done through the recognition of a precise word combination, it has not been possible to then observe the actual analog characteristics of the digital signals for noise, jitter, or the like.

SUMMARY OF THE INVENTION

The present invention combines the versatility of the oscilloscope with the combinational trigger capability of the logic analyzer to create a powerful new electronic tool. The invention is a multiple word recognizer, capable of generating a trigger output signal as the result of any Boolean function or combination of Boolean functions (AND, OR or NOT) of its input signals by means of a digital trigger path. In addition, any input signal may be designated as edge (transition) sensitive, rather than only threshold level sensitive. An external clock can also be used to provide additional trigger qualifications if synchronous operation is desired. A variable trigger filter, to inhibit triggering on narrow trigger pulses, is available for asynchronous, level sensitive functions. The invention also provides the feature of nested triggering, in which one function establishes an arming condition so that the subsequent occurrence of another independent function results in a trigger output signal, at which time the armed condition is reset.

The multiple channels of analog signals are processed by means of a high performance analog vertical amplifier for presentation on a visual display. A key development of the present invention is the use of a series of analog delay lines placed in series with the usual analog signal path of each analog channel to match the delay times of the analog signal path and the digital trigger path. Thus it is possible to insure the time-coincidence of the digitally generated trigger signal and the analog signals for presentation to the oscilloscope midframe and the visual display.

DETAILED DESCRIPTION OF THE INVENTION

Figure 1:
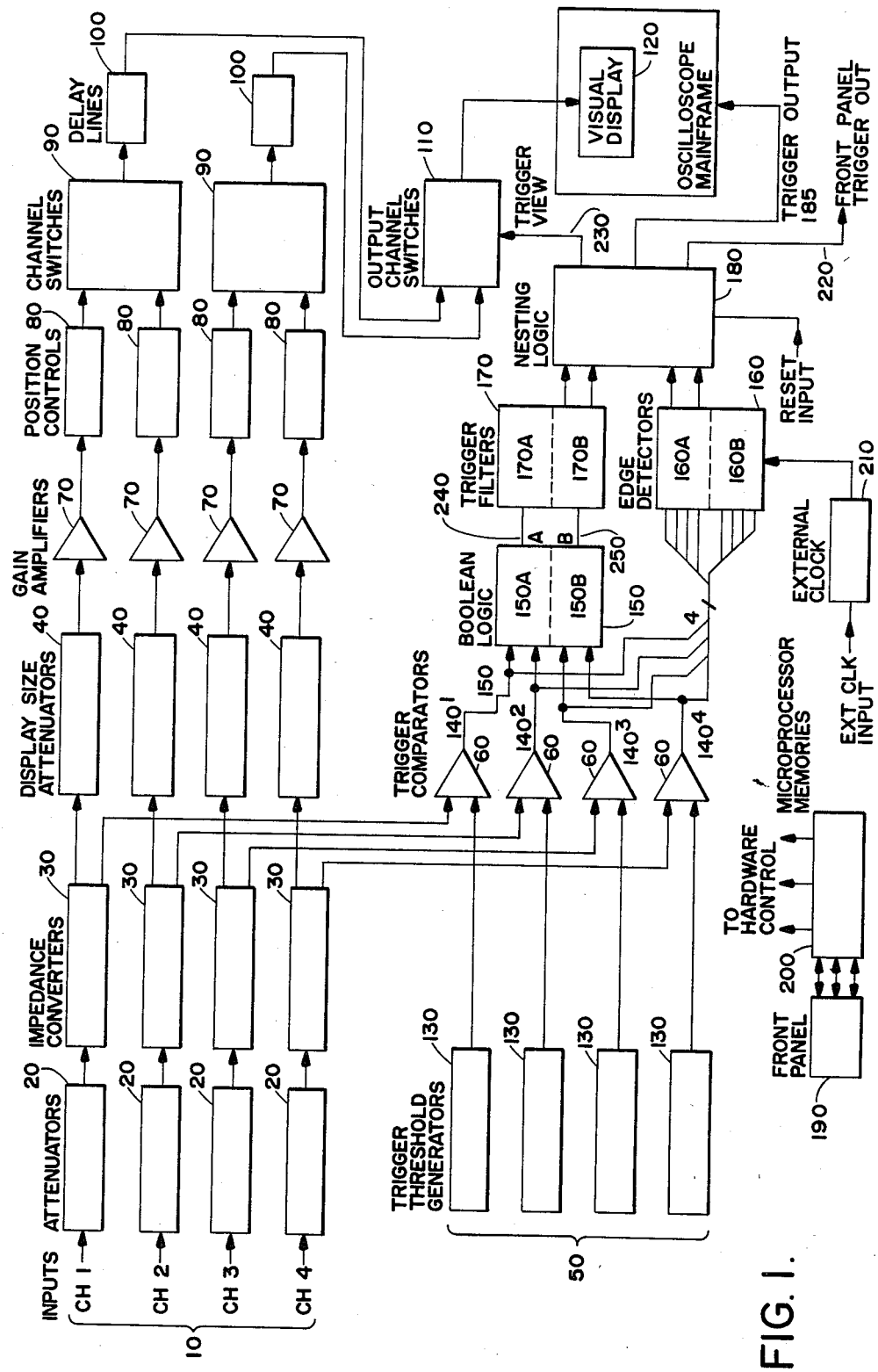
FIG. 1 shows a block diagram of the preferred embodiment of the present invention.

FIG. 1 shows a block diagram of the present invention as configured for a four channel oscilloscope amplifier having an analog signal path 10 and a digital path signal path 50. Conventional probes are attached to the four input terminals CH1-CH4 (Channels 1-4) to the analog signal path 10. Each input signal is then passed through an attenuator 20 (e.g. 5 times attenuation for TTL or CMOS signals, or zero attenuation for ECL signals) to an impedance converter 30, which may suitably be any impedance-matching device such as an emitter follower or the like. The impedance converters 30 deliver the signal to the user variable attenuators 40 to select display size, and also to the digital signal path 50 as input signals to the trigger comparators 60. The analog signal path 10 continues through the gain amplifiers 70, position control circuitry 80, channel select switches 90, analog delay lines 100, and output channel switches 110 to the visual display 120 via the main frame of the oscilloscope. Analog delay lines 100 are included to delay the analog signals sufficiently so that they are applied to the oscilloscope main-frame in time coincidence with the trigger information.

In the digital signal path 50, the output signals of impedance converters 30 are each individually compared with the independently variable threshold levels set by threshold generators 130 to form digital signals $140^1$, $140^2$, $140^3$ and $140^4$. It should be noted that the threshold levels of trigger threshold generators 130 can also be pre-set for particular logic families, e.g. TTL or ECL. Digital signals $140^1$–$140^4$ are digital reconstructions of the analog signals applied to the four input channels, CH1-CH4. Digital signals $140^1$–$140^4$ are then processed through Boolean trigger logic 150, edge detectors 160, trigger filters 170 and nesting logic 180 to generate the trigger and trigger view signals.

The Boolean trigger logic 150 is implemented in the form of two identical circuits, 150A and 150B, for generating two separate trigger functions A and B, each being two four-bit words (AND functions) ORed together. These trigger functions are programmed by the user and for example might be:

$$A = 1 \cdot 2 \cdot \overline{3} \cdot \overline{4}$$
$$B = \overline{1} \cdot 2 + 3 \cdot \overline{4}. \tag{1}$$

Output words A and B are sent, via lines 240 and 250 respectively, through or bypassed around the trigger filter 170 which includes two identical filters, 170A and 170B, one each for functions A and B, whose delay times track each other. The purpose of the trigger filters is to block any pulse of the A or B function that is shorter than a preset length of time. In parallel with the Boolean trigger logic 150 are edge detectors 160 implemented with two edge detectors for each function A and B. All four of the edge detectors have the capability of detecting either a rising or falling edge. There are two edge detectors for each of functions A and B with one edge detector for each function testing the first product of that function and a second edge detector testing the second product of that function. For a given product (AND function), there can be one edge sensitive channel. The remaining channels in that product (if used) are level sensitive only. The total trigger functions from this product is the "AND function" of the level sensitive channels tested at the time of the selected edge sensitive channel transition.

When an external clock transition is used to qualify the Boolean trigger logic 150, it is applied to all the edge detectors 160 via external clock logic 210. In this mode channel edge detection is not possible.

Next the filtered functions A and B, and the detected edge information is applied to the nesting logic 180. Via the nesting logic 180 the user has the option of triggering on functions A or B singly, or using function A as the trigger arming condition and function B as the trigger condition.

Independent selection of each channel's trigger switching threshold, display size, position, input impedance, or ground reference is controlled by the user via vertical amplifier front panel 190 and a microprocessor 200, as is the selection of the Boolean trigger functions, A and B. Front panel 190 also includes an input terminal for an external clock signal which can provide further trigger qualification by means of external clock logic 210 and edge detectors 160. A reset input terminal is also provided on the front panel 190 to allow for the resetting of the armed condition for the nesting trigger logic 180. The trigger signal is directed to front panel 190 via line 220 for user access, as well as to the oscilloscope main-frame via line 185. A trigger view signal on line 230 is applied to the output channel switches 110 to provide an added trace on the visual display 120 for observing the actual digital trigger signal in relationship with the analog input signals.

The logic blocks of FIG. 1 will now be explained in detail with reference to the schematics of FIGS. 2 through 4.

Trigger Threshold Generators 130

Figure 2A:
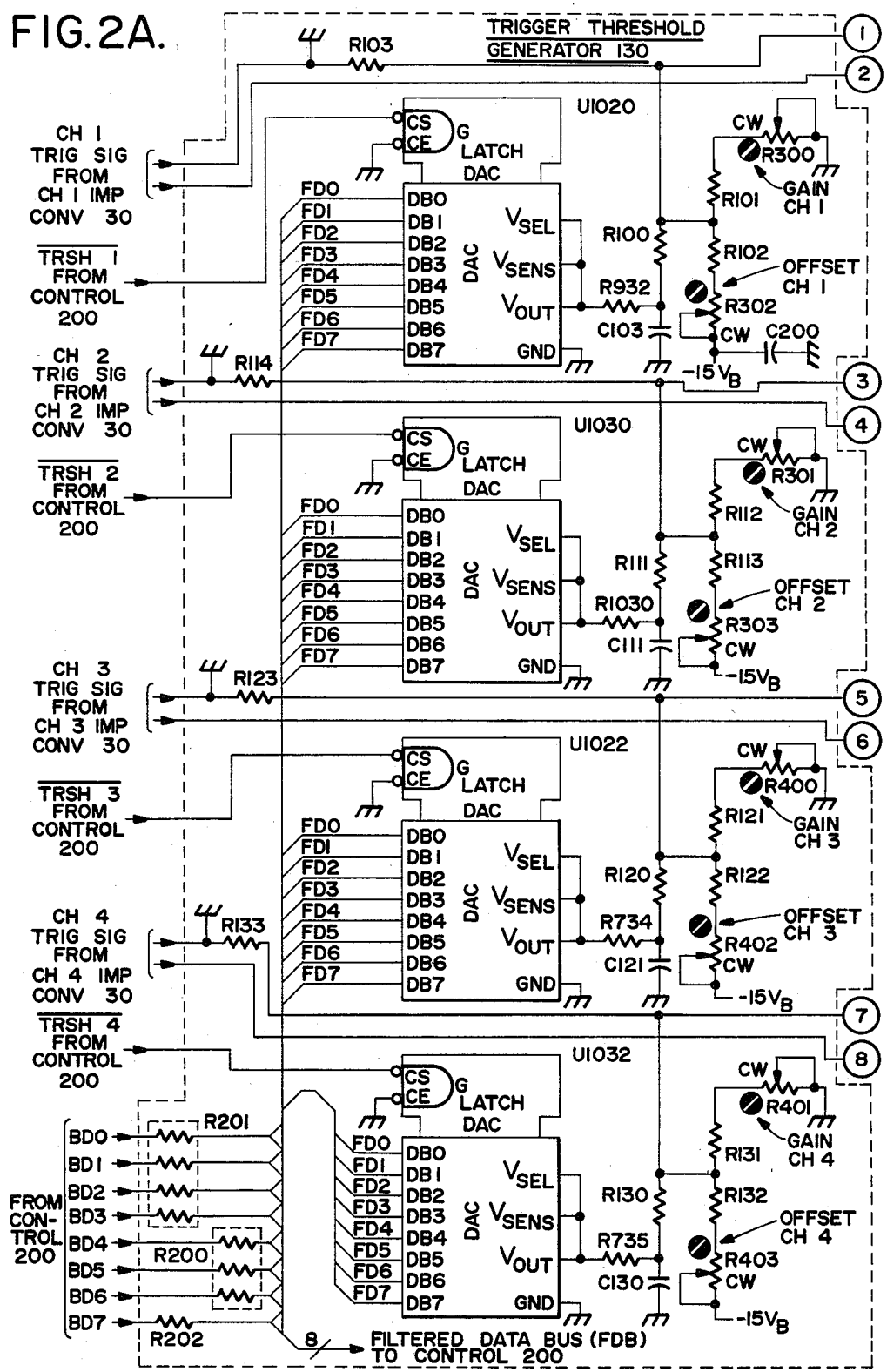
FIGS. 2A, 2B, and 2C, in combination, show a schematic diagram of the trigger threshold generators, trigger comparators, Boolean logic and trigger filters of FIG. 1.

The trigger threshold generators 130 for channels 1 through 4 as shown in FIG. 2A are implemented independently by threshold digital to analog converters (DACs) U1020, 1030, 1022, and 1032 respectively. The DACs are controlled by the buffered data bus, including the signals BD0–BD7, the data byte from the microprocessor 200, which passes through series resistances R200, 201, and 202 to form the filtered data bus, including the signals FD0–FD7. The coding of signals BD0–BD7 represents a binary number that is proportional to the desired analog threshold voltage for trigger threshold generators 130. Slower transition times on the filtered data bus require that data written to the trigger include a wait state. A low level signal on write strobe lines $\overline{TRSH1}$–$\overline{TRSH4}$ latches data into the DACs. The analog output voltage range of the DACs is from 0 V to +2.55 V. A resistive divider network shifts this range down to −0.48 V to +0.48 V at the comparator input terminals and provides gain and offset adjustment.

Trigger Comparators 60

Figure 2B:
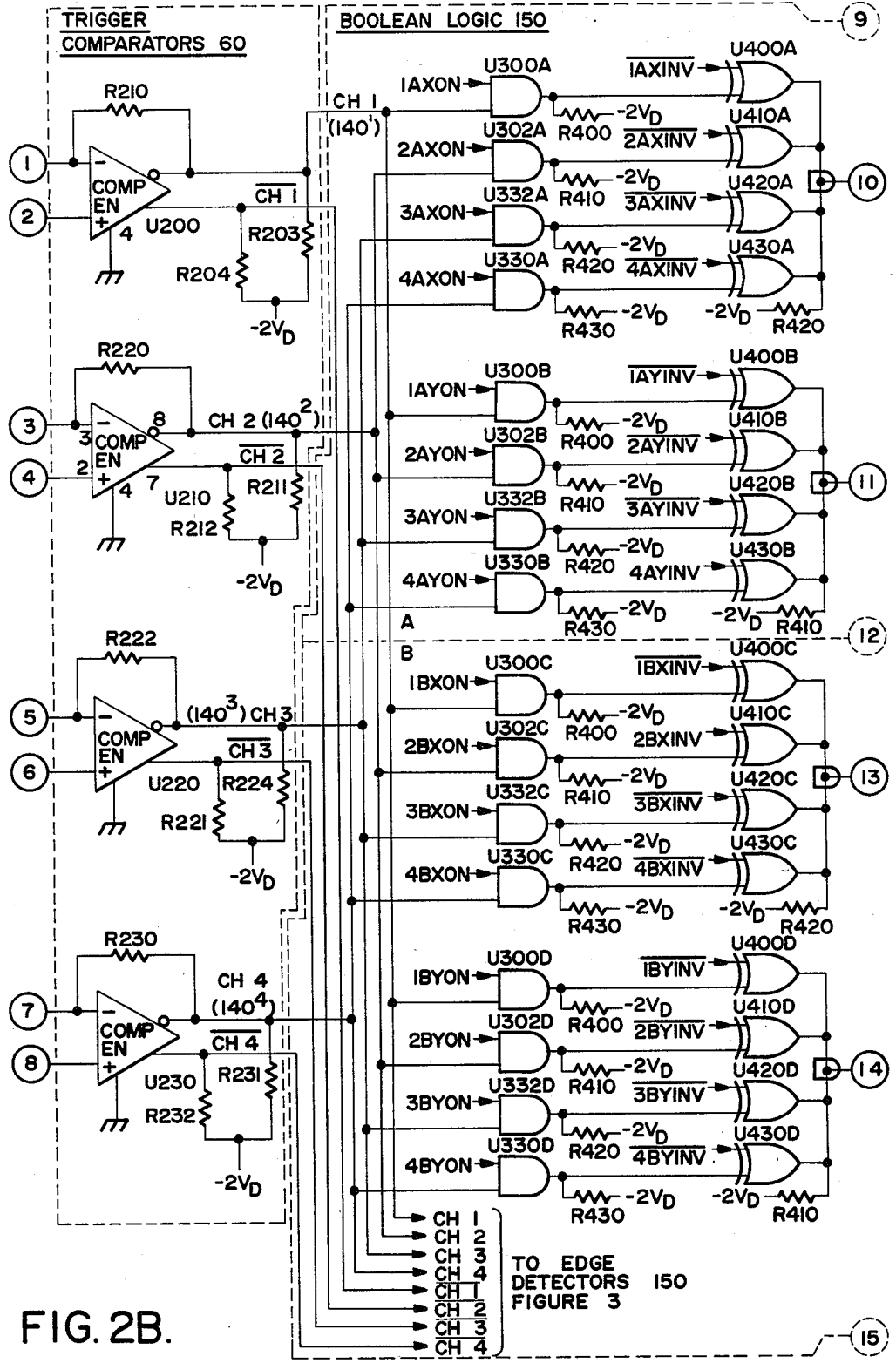

The channel 1 through 4 comparators U200, 210, 220, and 230, as shown in FIG. 2B convert the analog signals from the channel 1 through 4 impedance converters 30 to ECL level complementary digital signals. The resistors R210, 220, 222 and 230 from the inverted output terminal to the negative input terminal of the comparators supply positive feedback and provide a fixed amount of hysteresis. The comparator 60 output signals drive the Boolean Logic 150 and Edge Detectors 160.

Boolean Logic 150

Figure 2C:
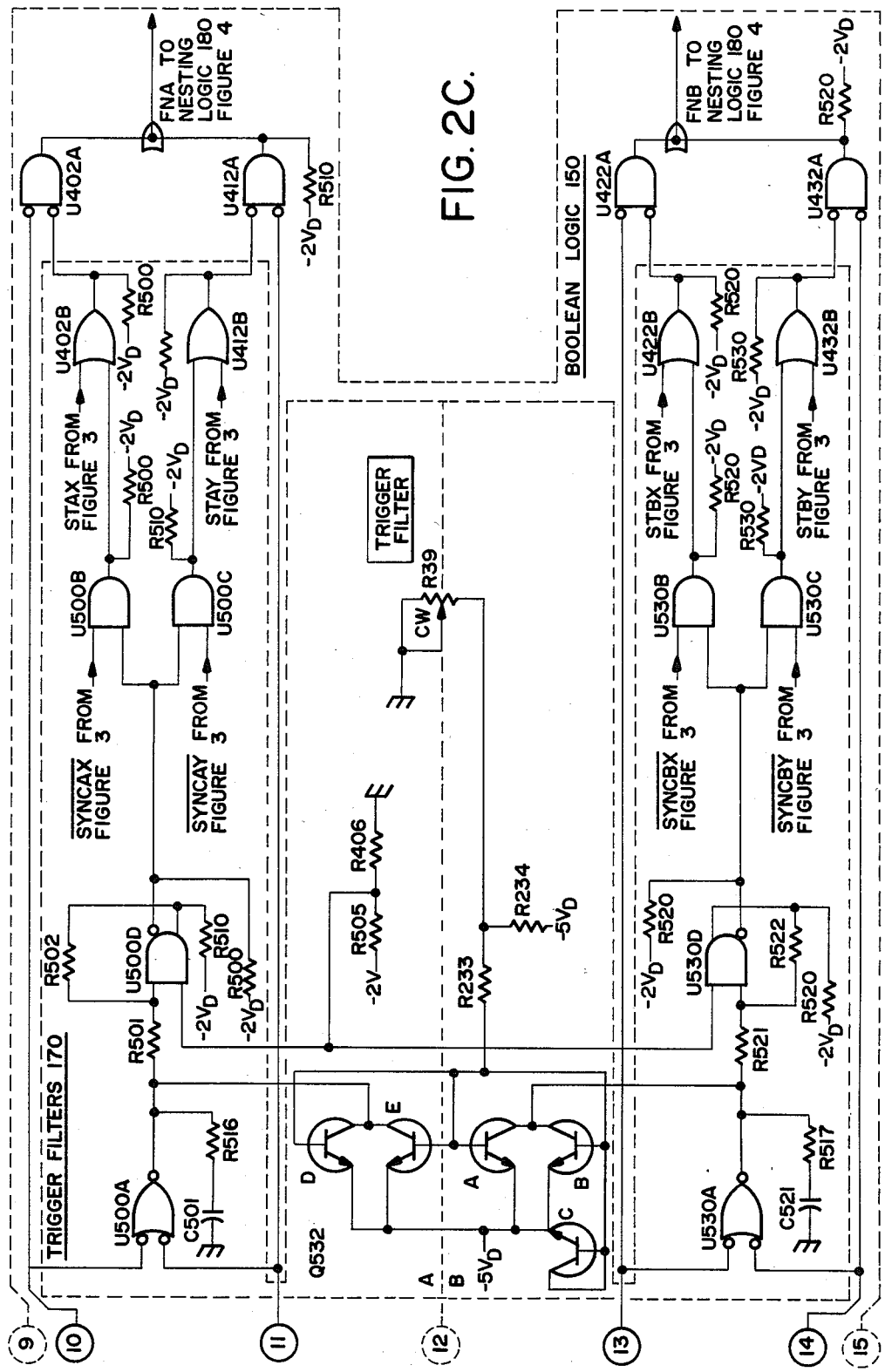

The Boolean Logic 150 as shown in FIGS 2B and 2C is divided into two parts, function A and function B. Each function consists of two products of four bits for each of the digital input signals ($140^1$, $140^2$, $140^3$, $140^4$ of FIG. 1). Each product is implemented with AND gates from U300, 302, 332, and 330 which select the channels forming the product, and with EXCLUSIVE OR (EXOR) gates from U400, 410, 420, and 430, which set those channels to be active high or active low. The AND function which forms the product is a negative logic wired-AND of the EXOR gate outputs. The Boolean Logic gates U300, U302, U332, U330, U400, U410, U420, and U430 are controlled by 32 trigger control lines from microprocessor 200 (FIG. 1).

Figure 4A:
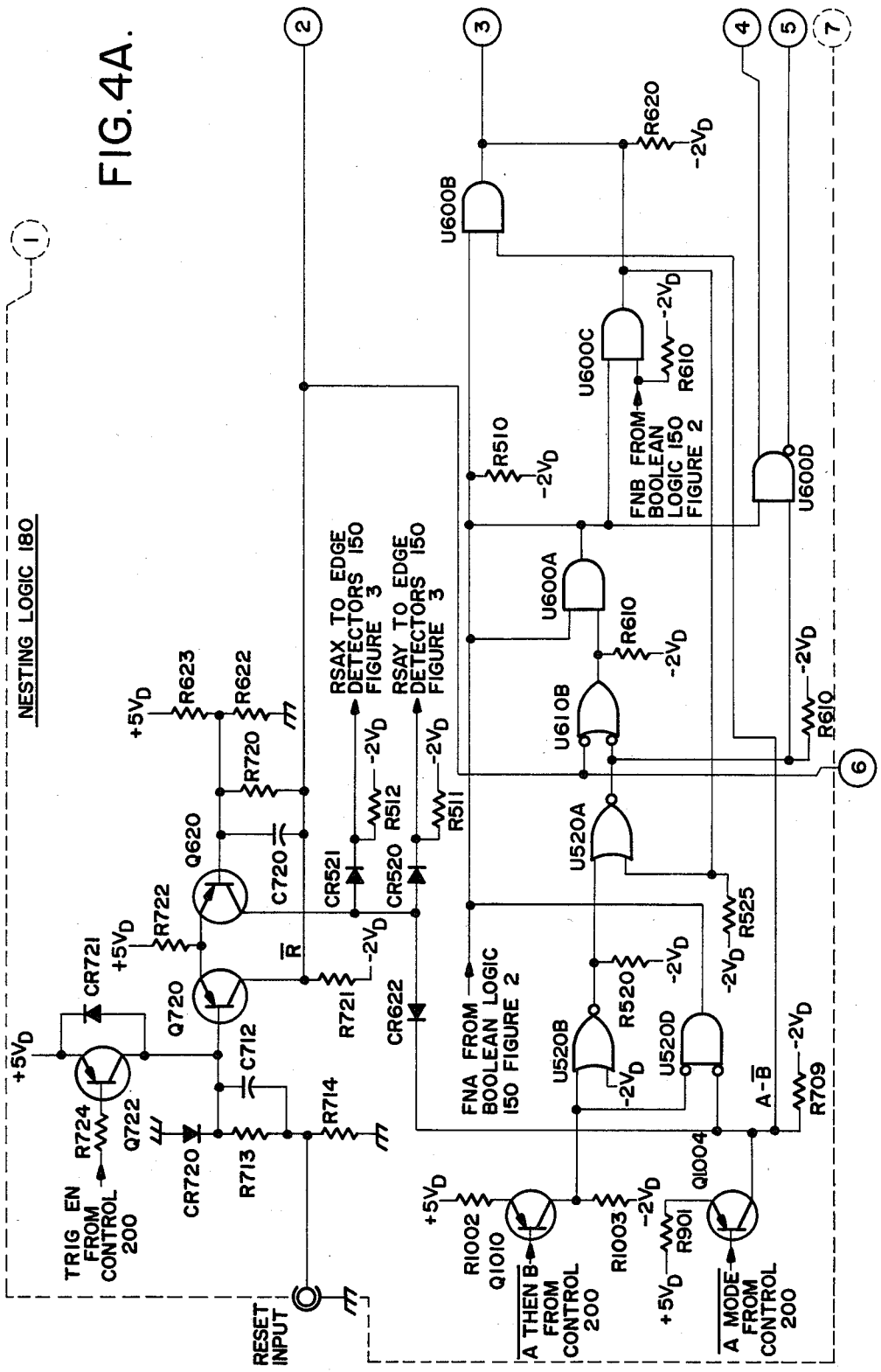
FIGS. 4A, 4B, and 4C, in combination, show a schematic diagram of the nesting logic and external clock logic of FIG. 1.
Figure 4B:
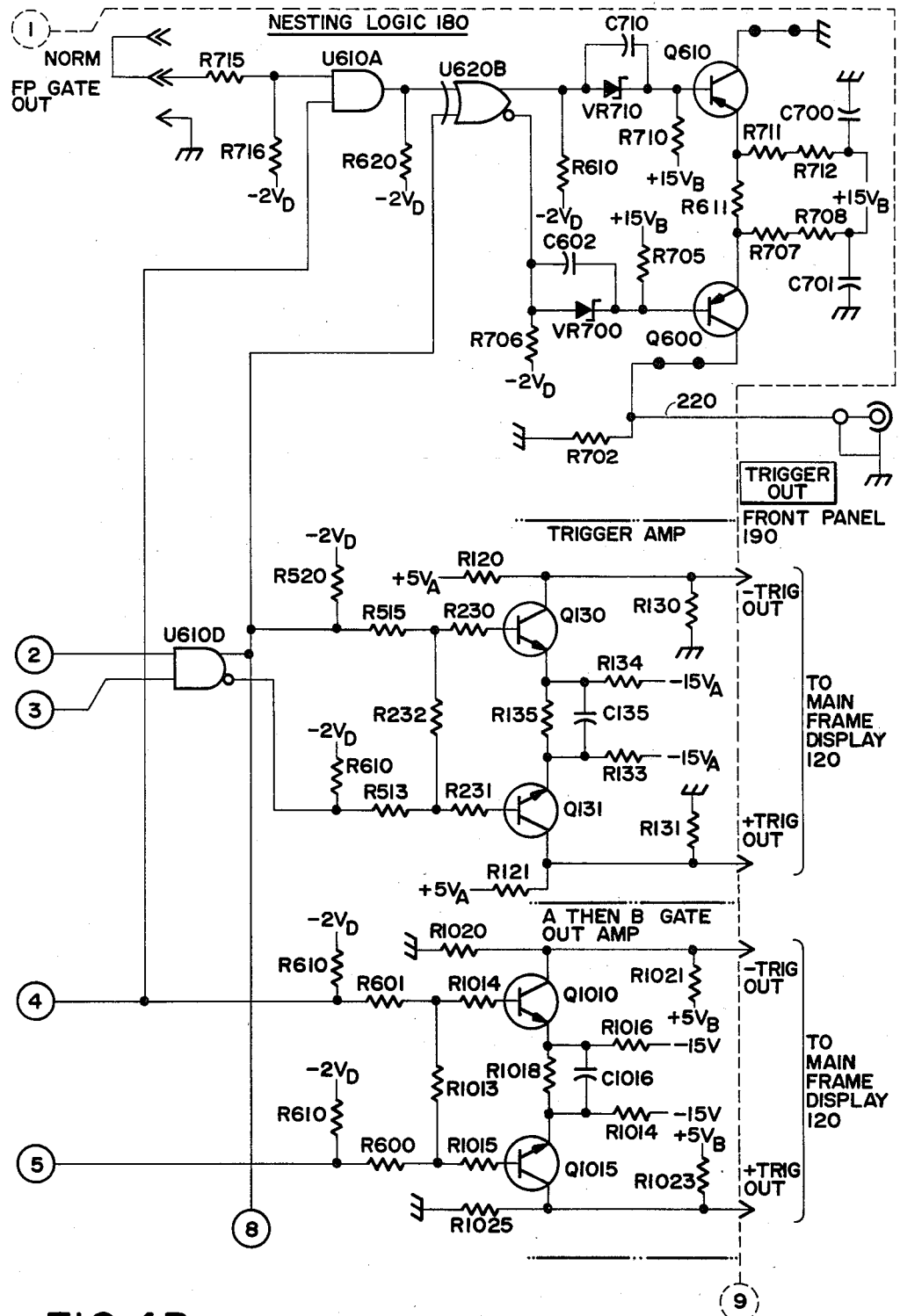
Figure 4C:
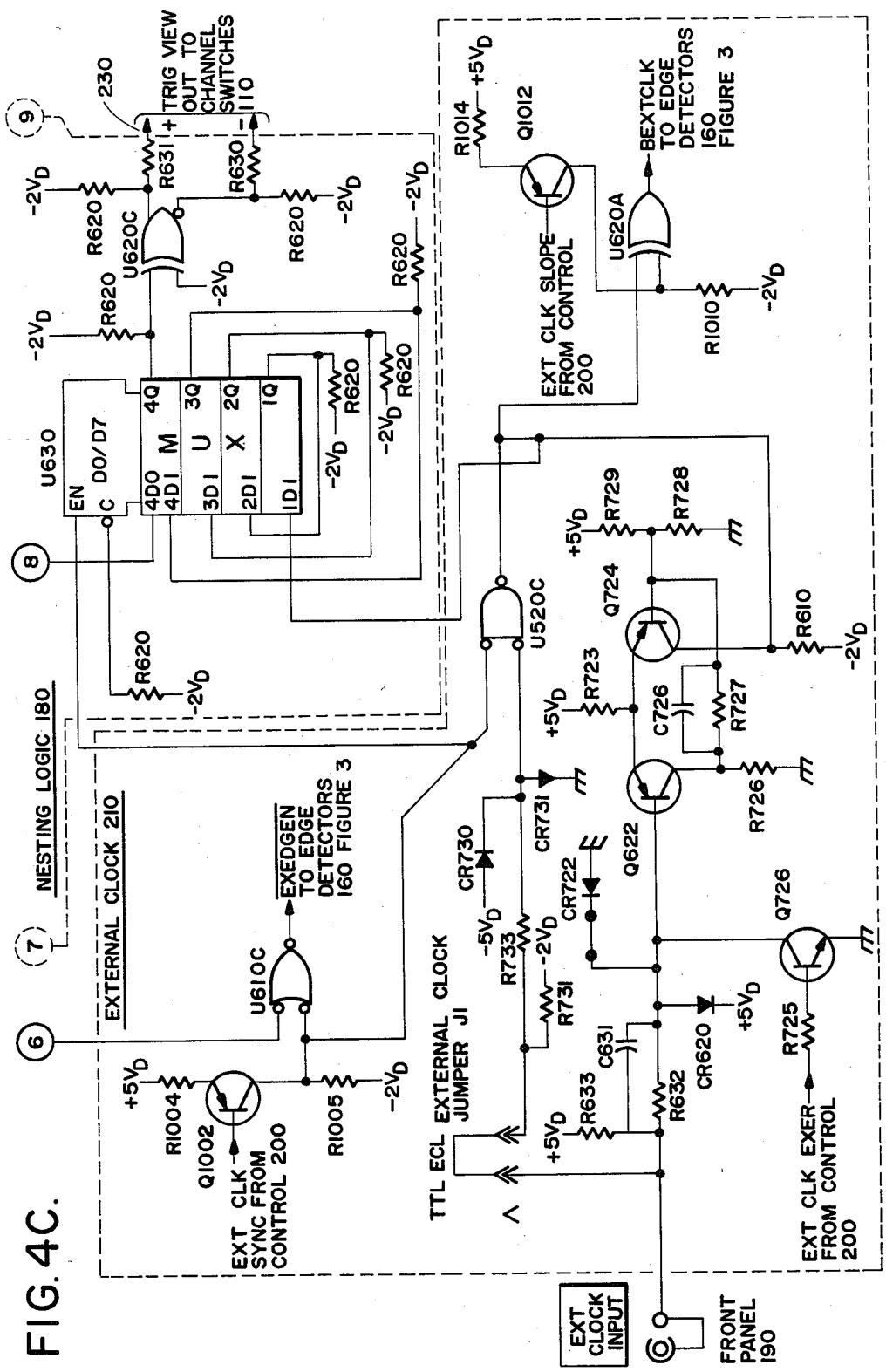

There are several rules regarding the control of the Boolean Logic gates U300, U302, U332, and U330, U400, U410, U420, and U430. The ON lines (1AXON, 3BYON, etc.) must be low for any unused channels in a product. The $\overline{INV}$ lines ($\overline{1AXINV}$, $\overline{3BYINV}$, etc.) must be manipulated depending upon the state of the rest of the channels in the product. If any channel in a particular product is used, the $\overline{INV}$ lines of unused channels in that product (if any) must be set low. If the entire product is unused, $\overline{INV}$ must be set high for at least one channel. If a given product is edge sensitive and contains no level sensitive channels, $\overline{INV}$ must be set low for all channels in that product. The signal path from the wired-AND of each product through gates U402A, 412A, 422A and 432A where the two products of each function are wire-ORed together to form signals FNA and FNB (A and B on lines 240 and 250 of FIG. 1) which are coupled to the nesting logic 180 (FIGS. 4A–4C). These signals go high when the function is true.

To better understand this section of the circuit note that the labels of signals 1AXON–4AXON, 1AYON–4AYON, $\overline{1AXINV}$–$\overline{4AXINV}$, $\overline{1AYINV}$–$\overline{4AYINV}$, and a similar set of B function signals, are encloded as follows:

the numeral indicates the input channel signal of interest the A or B designates the two Boolean trigger functions X designates the first product of the trigger function Y designates the second product, if any, of the trigger function ON, if the signal is true, causes the inclusion of that channel signal in the trigger function INV, if the signal is true, inverts the channel signal for inclusion in the trigger function.

For example, using equations (1), which are repeated here for reference, the state of the signals of Boolean logic 150 are shown below.

First note that function A is a single product and function B is two products.

For function: $A = 1 \cdot 2 \cdot \overline{3} \cdot \overline{4}$

| | |
|---|---|
| 1AXON - true (high) | |
| 2AXON - true (high) | All channels represented |
| 3AXON - true (high) | in Function A |
| 4AXON - true (high) | |

| | |
|---|---|
| $\overline{1AXINV}$ - false (high) | Channels 1 and 2 not |
| $\overline{2AXINV}$ - false (high) | inverted in Function A |

-continued

| | |
|---|---|
| $\overline{3AXINV}$ - true (low) <br> $\overline{4AXINV}$ - true (low) } | Channels 3 and 4 inverted in Function A |
| 1AYON–4AYON - false (low) | Function A is a single product function |
| $\overline{1AYINV}$ – $\overline{4AYINV}$ - true (high) | Unused in Function A |

For function: $B = \bar{1} \cdot 2 + 3 \cdot \bar{4}$

| | |
|---|---|
| 1BXON - true (high) <br> 2BXON - true (high) } | Channels in first product of Function B |
| 3BXON - false (low) <br> 4BXON - false (low) } | Channels not in first product of Function B |
| $\overline{1BXINV}$ - true (low) | Inverted in Function B |
| $\overline{2BXINV}$ - false (high) | Not inverted in Function B |
| $\overline{3BXINV}$ - true (low) <br> $\overline{4BXINV}$ - true (low) } | Unused Channels in first product of Function B |
| 1BYON - false (low) <br> 2BYON - false (low) } | Channels not in second product on Function B |
| 3BYON - true (high) <br> 4BYON - true (high) } | Channels in second product of Function B |
| $\overline{1BYNIV}$ - true (low) <br> $\overline{2BYNIV}$ - true (low) } | Unused channels in second product of Function B |
| $\overline{3BYNIV}$ - false (high) | Not inverted in Function B |
| $\overline{4BYNIV}$ - true (low) | Inverted in Function B |

(Note:
in the positive logic convention, signal names with a bar over them e.g.
$\overline{1AXINV}$, are true when low and false with high.)

Trigger Filters 170

The function A and B trigger filters 170A and 170B, as shown in FIG. 2C, are separate but identical, and provide amounts of time delay which track one another. The trigger filter for a given function is not operational if either product from the Boolean logic 150 in that function contains an edge sensitive chnnel or if the trigger filter 170 is turned off. The following description for function A applies to function B as well. If both products in function A are level sensitive only, and the trigger filter 170 is turned on, the signal on control lines STAX, and STAY from edge detectors 160 will be low, and $\overline{SYNCAX}$ and $\overline{SYNCAY}$, also from edge detectors 160, will be high. The output signal of gate U500A will be high until either product becomes true. At that time it will begin to go low at a rate determined by the capacitor C501 and the current from transistors Q532. As soon as it is low enough to cross the switching threshold of threshold detector U500D, positive feedback from the output terminal of U500D speeds the transition and sends a positive going signal to gates U402B and U412B and then a negative going signal to gates U402A and U412A. This negative level enables either gate U402A or U412A allows the waiting signal at the other input terminal to pass through. The principle of the trigger filter is that if the delay time caused by capacitor C501 on U500A exceeds the time that the product is true, the resultant function, FNA, will not become true.

When the products become false, that is both high, the output of gate U500A will go high and rapidly charge capacitor C501, readying it for the next cycle.

When trigger filter 170 is turned off from the front panel 190, the lines STAX and STAY from the edge detectors 160 will go high. This presents low levels to U402B and U412B, enabling them continuously.

A dual two-times Current Mirror circuit transistor Q532 provides twin tracking DC current sources to the function A and function B trigger filters 170A and 170B. Each current source is twice the magnitude of the current flowing into the circuit through the resistor R233 and therefore dependent upon the position of the front panel potentiometer R39. The base-emitter voltage for transistor Q532B, C, D, and E is set by transistor Q532A. Since all transistors are closely matched within a single integrated circuit, their collector currents will be equal with equal base-emitter voltages.

Edge Detectors 160

Figure 3A:
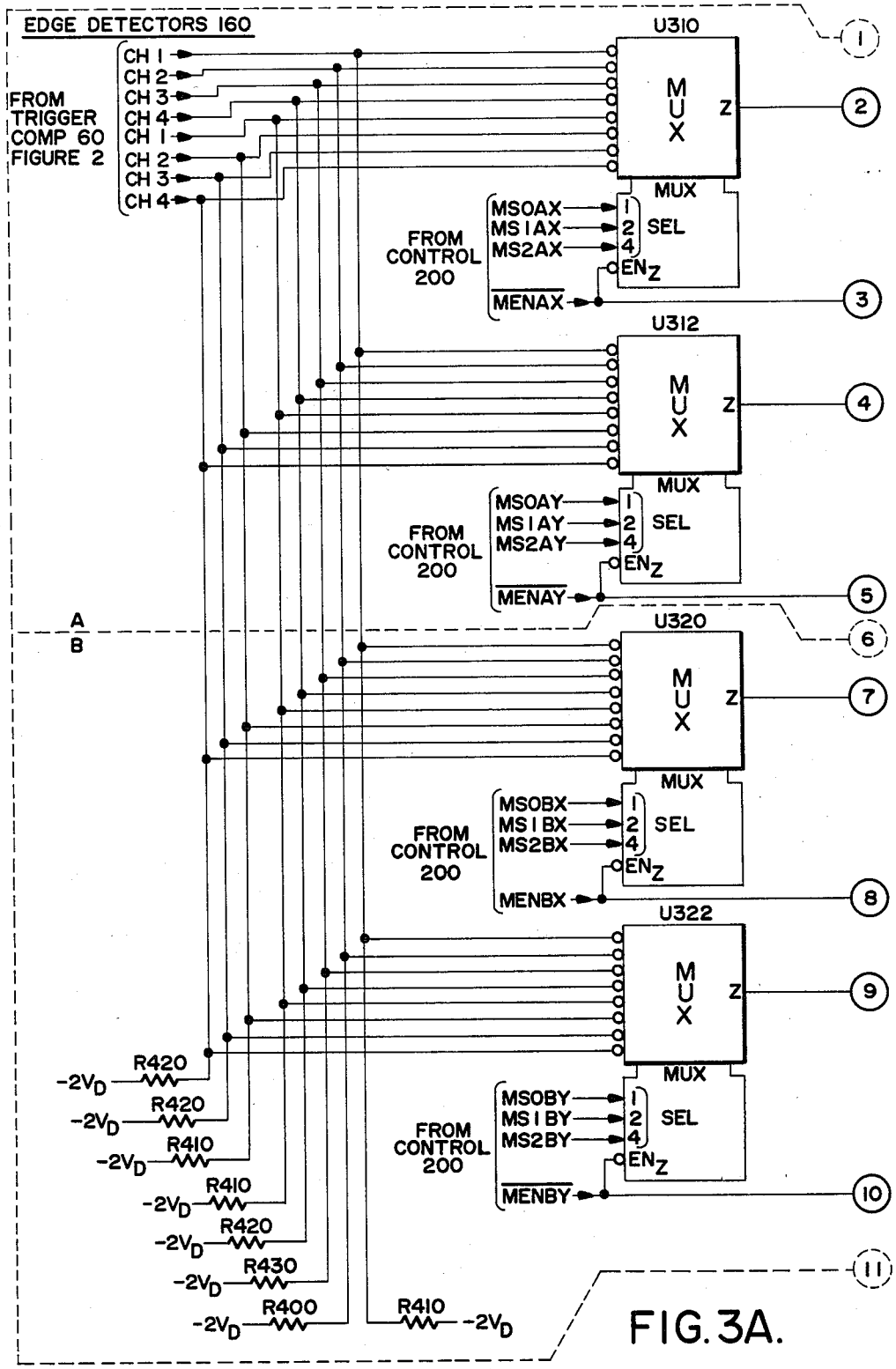
FIGS. 3A, 3B, and 3C, in combination, show a schematic diagram of the edge detectors of FIG. 1.
Figure 3B:
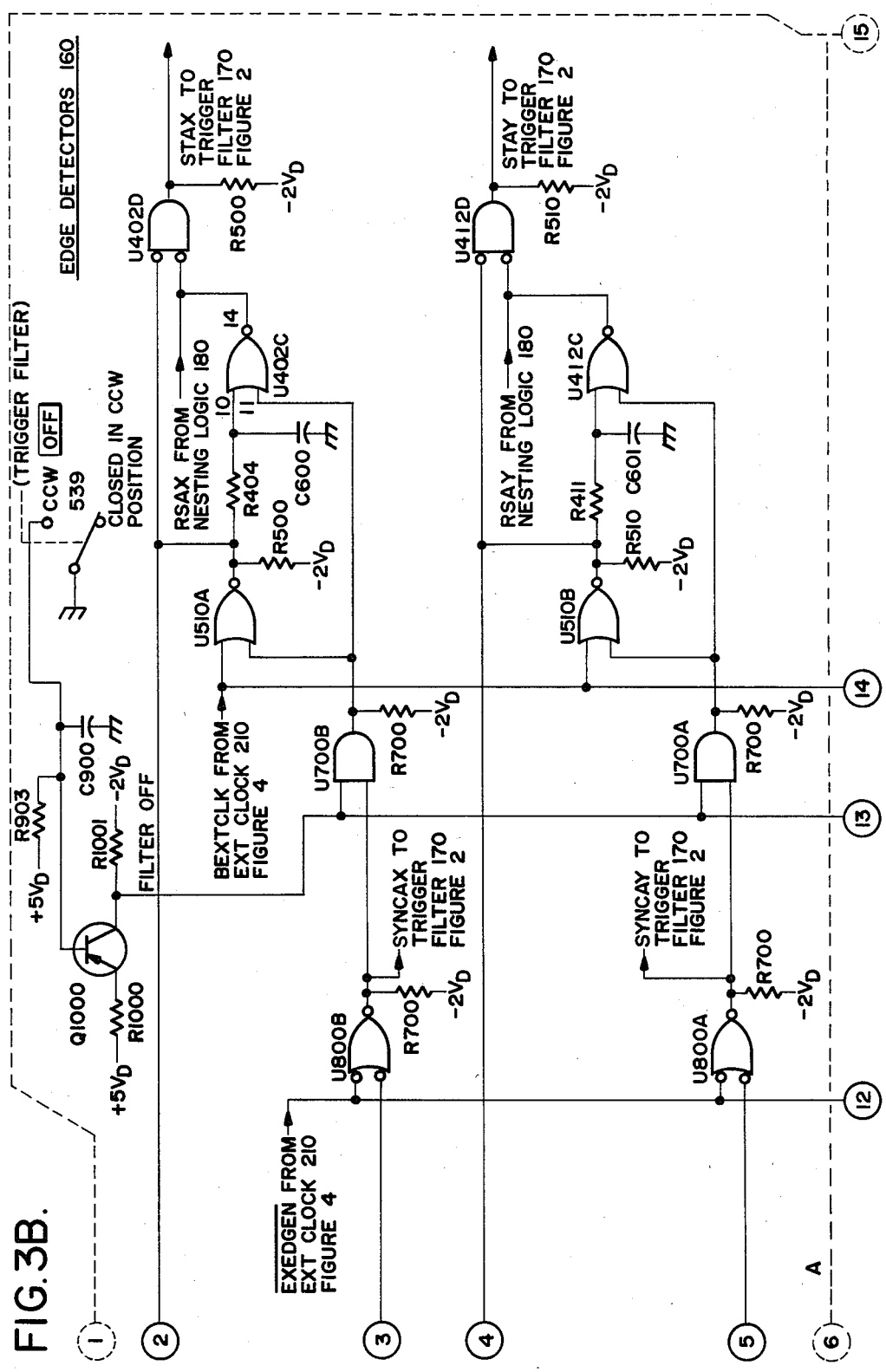
Figure 3C:
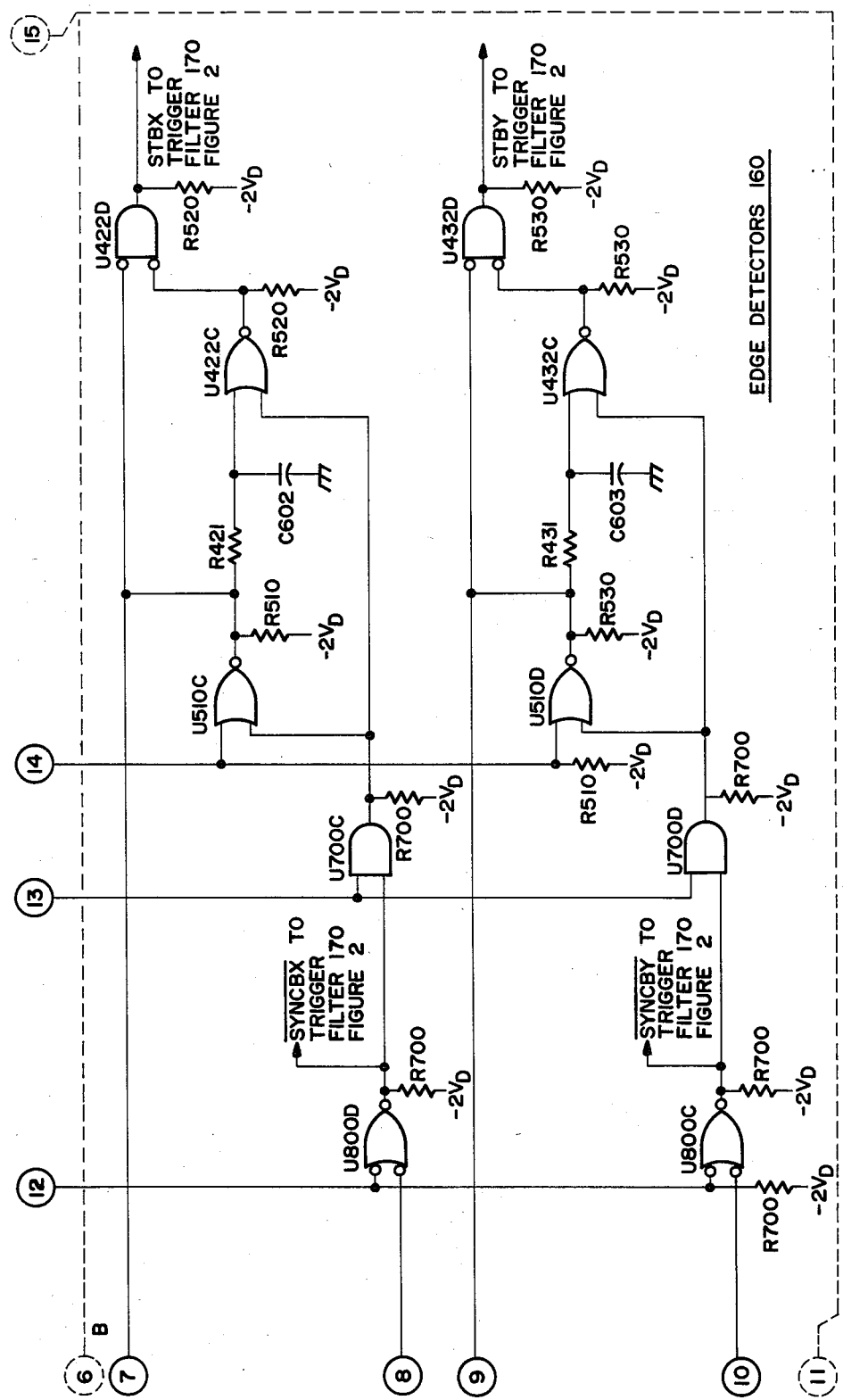

There are four independent edge detector circuits 160 as shown in FIGS. 3A–3C, one for each product in functions A and B of the Boolean Logic 150. The following description for the one associated with the first product of function A applies to all others as well. The channel 1 through 4 digitally simulated signals (CH1–CH4) and their complements are presented to the input terminals of the multiplexer U310. If the product contains an edge sensitive channel, the control signal, $\overline{MENAX}$, will be low to enable the multiplexer output. Signals MS0AX, MS1AX, and MS2AX will be high or low to select the proper channel and polarity so that the multiplexer output signal will make a negative going transition corresponding to the channel edge to which sensitivity has been programmed. Since $\overline{MENAX}$ is low, the output signal of NOR gate U800B is low as is the output signal of AND gate U700B. The signal $\overline{SYN}$ $\overline{CAX}$, goes low to disable the trigger filter 170 of FIG. 2C. Before the transition designated to be detected occurs, the output signal of multiplexer U310 will be high, setting the output signal of NOR gate U402C low. When the transition occurs, the multiplexer U310 output signal will go low and the output signal of NOR gate U402C will go high momentarily until a high level has propagated to NOR gate U402C's output signal, at which time it will return to the low state. The width of this pulse is detemined by the propagation delay of NOR gate U402C and the added delay of the series resistor R404 and shunt capacitor C600. This pulse becomes the signal, STAX, which strobes the level sensitive portion of the trigger function of FIG. 2C (if any) on to the output terminal. When the output signal of multiplexer U310 goes high the circuitry is restored to its initial state.

All four edge detectors work in unison when the external clock circuitry is activated. In this mode, signals $\overline{MENAX}$, $\overline{MENAY}$, $\overline{MENBX}$, and $\overline{MENBY}$ are all high and the signal, $\overline{EXEDGEN}$, is low. The external clock signal occurs with the signal BEXTCLK. When BEXTCLK goes high the output signal of NOR gate U510A goes low and produces a STAX pulse and the falling edge of BEXTCLK restors the circuitry as explained above.

When trigger filter 170 is turned off from the front panel 190 via switch S39 and transistor Q1000 (FIG. 3B), the signal, FILTER OFF, goes high. If, for instance, function A contains no edge sensitive channels and the external clock is not being used, $\overline{\text{SYNCAX}}$ AND $\overline{\text{SYNCAY}}$ will be high. With FILTER OFF high, the output signals of AND gates U700 A-D, will go high forcing the output signals of NOR gates U402C and U412C low, and therefore STAX and STAY will be high to prevent the trigger filter from functioning.

Note that in signals $\overline{\text{MENAX}}$, etc. that MEN indicates that the signal is a multiplexer enable signal, the A designates that it is for trigger function A, and the X and Y designated that it is for the first or second product, respectively of the particular function. Thus, if none of the channel signals within the particular product of the trigger function are designated as edge sensitive, the $\overline{\text{MENxx}}$ signal for that product is false (high). For function A and B of equations (1) above, all of these signals are true to inhibit the multiplexers. While the $\overline{\text{MENxx}}$ signals are high, the signals MS$\phi$AX, MS1AX, MS2AX, etc. are not controlling, and therefore ignored by the respective multiplexer. The purpose of the MS$\phi$AX et al signals is to identify the channel signal which has been selected to be edge sensitive, and to designate whether it is the rising or falling edge that is to be used to trigger on.

It should be noted before considering the following example of edge sensitive triggering that the edge detectors work in conjunction with the Boolean logic 150. Edge detectors 160 handle the edge sensitive channel information and the Boolean logic 150 handles the level sensitive channel information.

Consider the trigger function:

$$A = 1 \cdot \overline{2} \cdot \overline{\text{Edge 4}} \qquad (2)$$

That is trigger function A is true when the channel 1 signal is high, the channel 2 signal is low, and the channel 4 signal makes a transition from the high to the low state (falling edge). For equation (2), the corresponding Boolean logic 150 and edge detector 160 signals are as follows:

| | | |
|---|---|---|
| 1AXON - high | $\overline{\text{1AXINV}}$ - high | (1) |
| 2AXON - high | $\overline{\text{2AXINV}}$ low | ($\overline{2}$) |
| 3AXON - low | $\overline{\text{3AXINV}}$ - low | Unused or edge sensitive |
| 4AXON - low | $\overline{\text{4AXINV}}$ - low | |
| 1AYON - low | $\overline{\text{1AYINV}}$ - high | |
| 2AYON - low | $\overline{\text{2AYINV}}$ - high | Unused in Function A |
| 3AYON - low | $\overline{\text{3AYINV}}$ - high | |
| 4AYON - low | $\overline{\text{4AYINV}}$ - high | |
| $\overline{\text{MENAX}}$ - low | Function A, first product multiplexer enabled | |
| $\overline{\text{MS}\phi\text{AX}}$ - high $\overline{\text{MS1AX}}$ - high $\overline{\text{MS2AX}}$ - low | Selects falling edge of channel 4 signal | |

To form the trigger function A of equation (2), the STAX signal from gate U402D which is combined with the level sensitive information signal from Boolean logic 150 in gate U402A (FIG. 2C) via trigger filter 170. The delegation of tasks to the Boolean logic 150 and edge detectors 160 is done by microprocessor 200 (FIG. 1) in response to user instructions.

A THEN B Nesting Logic 180

The A THEN B Nesting logic 180 as shown in FIGS. 4A-4C passes the trigger signal from the trigger filters 170 to the trigger outputs in one of three modes: A mode, B mode, or A THEN B mode. The mode is determined by the control lines $\overline{\text{A THEN B}}$ and $\overline{\text{A MODE}}$.

In A mode, the signal $\overline{\text{A THEN B}}$ will be high and the signal $\overline{\text{A MODE}}$ will be low. The signal FNA from the function A trigger filter 170A, FIG. 2C, can propagate through AND gates U600B and U610D to the trigger output terminals. This is possible because the output signal of NOR gate U520D is not pulling high and because the output signal of NOR gate U520B is high, the output signal of NOR gate U520A and AND gate U610B are low, preventing AND gate U600A from latching. B mode operation is similar except that the signal propagates from FNB input through AND gates U600C and U610D to the trigger output terminals. The signals on both control lines ($\overline{\text{A THEN B}}$ and $\overline{\text{ANIDE}}$) must be high in this mode.

In A THEN B mode the signal on control line $\overline{\text{A THEN B}}$ will be low and the signal on control line $\overline{\text{A MODE}}$ will be high. an occurrence of function B causes a trigger output pulse and resets the armed condition. In this mode, the output signal of AND gate U610D is initially held low. When the signal FNA goes high, this high state is latched by AND gate U600A. A low signal level from the collector of Q1004 on AND gate U600B prevents this from reaching the trigger output terminals. However, AND gate U600C becomes enabled so that when the signal FNB goes high a trigger output signal occurs. When this happens, the output signal of AND gate U600C goes high causing the output signals of NOR gates U520A and 610B to go low, and resets latch U600A in preparation for the next cycle. The width of the resulting trigger output pulse is set by the propagation delays of gates U520A, U610B, U600A, and U600C. In this mode the A THEN B GATE OUTPUT is also active. The signal on the non-inverting output terminal of AND gate U600D goes high when function A occurs and back low again when function B occurs. By grounding R715 a representation of the A THEN B gate signal will also be available on the FRONT PANEL TRIGGER OUTPUT terminal via U610A and U620B.

Reset Input

The RESET function (FIG. 4A) differs slightly if the oscilloscope is in A THEN B mode rather than A mode or B mode. In the latter modes, when the reset input terminal is high, the trigger output signal is simply inhibited. In A THEN B mode, in addition to inhibiting the trigger output signal while high, it causes the armed condition to be reset if it has previously been set by function A being true (presumably function B has not been true since the last function A). After the reset signal is removed normal triggering will resume.

A reset input signal more positive than about 0.5 V causes the comparator stage of transistors Q720 and Q620 to switch. When signal $\overline{\text{R}}$ goes low, signals RSAX, RSAY, and A-$\overline{\text{B}}$ go high. When $\overline{\text{R}}$ goes low, the trigger output signal is immediately inhibited by AND gate U610D. That same signal propagates through NOR gate U610B to reset the A THEN B latch, AND gate U600A, assuming that the signal FNA is low. This is assured by RSAX and RSAY which act on NOR gates U402D and U412D (FIG. 3B) to force the signals STAX and STAY low. The signal R also forces EXED GEN, SYNCAX, and SYNCAY low to disable the trigger filter path as well to guarantee a false FNA signal.

External Clock Logic 210

If the external clock logic shown in FIG. 4C IS active, the control line EXT CLK SYNC will be high to present an ECL low level signal to AND gate U520C which enable the external clock buffers, a low level signal to OR gate U610C which enables the edge detectors 160, and a low which sets the trigger view multiplexer U630 to pass the external clock signal on to the output channel switch 110 in the analog signal path 10.

The external clock signal can be selected to have either TTL or ECL logic levels by a jumper J1. The TTL threshold is about +1.4 V, where the ECL is about −1.3 V. The external clock signal from the front panel 190 goes to the TTL buffer Q622 and the clock jumper J1. If the jumper J1 is in the TTL position, the ECL buffer (U520C) is disconnected. The TTL buffer consists of a differential amplifier stage (Q622 and Q724) with some positive feedback and hysteresis. The input to the stage is clamped to +5 V and ground to prevent overdrive. The output has ECL level voltage swings. With the ECL buffer disconnected, the output of U520C is not pulling high so the TTL buffer can drive exclusive OR U620A. If the jumper J1 is in the ECL position, the external clock input signal is now terminated into approximately 50 ohms to the −2 V bus so that it is compatible with the voltage levels of the ECL logic. Since the ECL high and low levels are both more negative than ground, the TTL buffer is always clamped in its low input state which results in a low output from transistor Q724 thus allowing ECL buffer U520C to drive exclusive OR U620A. The input signal of ECL buffer U520C is clamped to ground and −5 V to prevent damage from overdrive. The control line EXT CLK EXER is used in self test and extended diagnostics to synthesize a low level TTL clock level. If the jumper J1 is in ECL position, the input signal level is already low so EXT CLK EXER will have no effect.

The slope of the external clock is controlled by line EXT CLK SLOPE. The edge detectors 160 are sensitive to a rising edge of the signal BEXTCLK, so exclusive OR U620A is set to either invert or not invert the signal to select the desired clock edge. EXT CLK SLOPE is set high for a rising clock edge and low for a falling clock edge. If EXT CLK SYNC signal is not active (low) then the output signal of ECL buffer U520C is forced high and EXT CLK SLOPE signal is set high to assure that the BEXTCLK signal will be high so as not to interfere with the edge detectors 160 in channel edge sensitivity. The BEXTCLK signal is driven into the edge detectors 160 by NOR gates U510A, B, C, and D (FIGS. 3B and 3C).

Trigger View Signal

If the trigger view signal on line 230, as shown in FIG. 4, is selected from the front panel 190 and hardware control 200 (FIG. 1), the trigger view trace will be a representation of the trigger out signal on line 185 sent to the time base section of the oscilloscope main-frame and to a front panel output connector unless the external clock is active. If the external clock is on, the trigger view trace will display a representation of the external clock signal. The selection is made by multiplexer U630 which is controlled by the output signal of transistor Q1002. If the external clock is active, the signal applied to multiplexer U630 is delayed to make the external clock trace on display 120 to appear in time coincidence with the analog signal traces from CH1-4.

I claim:

1. An oscilloscope vertical amplifier for processing and displaying multiple analog input signals, said vertical amplifier comprising:
   analog signal path means for receiving and processing said analog input signals for display on a viewing screen; and
   digital trigger path means for deriving a display trigger signal from a selectable Boolean logic word combination of said analog input signals.

2. An oscilloscope vertical amplifier as in claim 1 wherein said analog signal path means includes signal delay means for delaying the processed analog input signals so that they occur in time coincidence with the display trigger signal from the trigger path means.

3. An oscilloscope vertical amplifier as in claim 1 wherein said digital trigger path means includes:
   trigger threshold generator means for providing selectable threshold voltages;
   comparator means for digitally reconstructing the analog input signals in response to the selectable threshold voltages and the analog input signals; and
   Boolean logic means for generating at least one display trigger signal from selectable Boolean logic word combinations of said digitally reconstructed analog input signals.

4. An oscilloscope vertical amplifier as in claim 1 wherein said Boolean logic combination is selected from at least one of the Boolean functions AND, OR, and NOT.

5. An oscilloscope vertical amplifier as in claim 3 wherein said Boolean logic combination is selected from at least one of the Boolean functions AND, OR and NOT.

6. An oscilloscope vertical amplifier as in claim 3 wherein said Boolean logic means includes a word recognizer means for generating a trigger signal for each word selected.

7. An oscilloscope vertical amplifier as in claim 6 wherein said digital trigger path means further comprises a trigger filter means for selectively inhibiting the trigger signal for each selected Boolean word when the duration of the particular trigger signal is shorter than a selected length of time.

8. An oscilloscope vertical amplifier as in claim 6 wherein said digital trigger path means further comprises nesting logic means for generating a display trigger signal that is a sequential combination of at least two Boolean word trigger signals.

9. An oscilloscope vertical amplifier as in claim 3 wherein said digital trigger path means further includes external clock means for generating a display trigger signal that is a Boolean logic combination of said digitally reconstructed analog input signals and an external clock signal.

10. An oscilloscope vertical amplifier as in claim 3 wherein said digital trigger path means further includes edge trigger means responsive to said Boolean logic word combinations for generating a display trigger signal that is timed to begin when the states of analog input signals are in the selected states as per the Boolean logic words as determined by the occurrence of at least one of the positive and negative transitions of at least one of those signals.

11. An oscilloscope vertical amplifier as in claim 10 wherein said analog signal path means includes signal delay means for delaying the processed analog input signals so that they occur in time coincidence with the display trigger signal from the trigger path means.

12. An oscilloscope vertical amplifier as in claim 10 wherein said Boolean logic combination is selected from at least one of the Boolean functions AND, OR, and NOT.

13. An oscilloscope vertical amplifier as in claim 10 wherein said Boolean logic means includes a word recognizer means for generating a trigger signal for each word selected.

14. An oscilloscope vertical amplifier as in claim 10 wherein said digital trigger path means further comprises a trigger filter means for selectively inhibiting the trigger signal for each selected Boolean word when the duration of the particular trigger signal is shorter than a selected duration.

15. An oscilloscope vertical amplifier as in claim 13 wherein said digital trigger path means further comprises nesting logic means for generating a display trigger signal that is a sequential combination of at least two Boolean word trigger signals.

16. An oscilloscope vertical amplifier as in claim 10 wherein said digital trigger path means further includes external clock means for generating a display trigger signal that is a Boolean logic combination of said digitally reconstructed analog input signals and an external clock signal.

17. An oscilloscope vertical amplifier as in claim 3 wherein:
    said digital trigger path means includes means for generating a trigger view signal; and
    said analog signal path means includes means for selectively adding the trigger view signal to the analog input signals for display in time coincidence one with the other.

18. An oscilloscope vertical amplifier as in claim 10 wherein:
    said digital trigger path means includes means for generating a trigger view signal; and
    said analog signal path means includes means for selectively adding the trigger view signal to the analog input signals for display in time coincidence one with the other.

* * * * *